US007778043B2

(12) United States Patent
Rosenblatt

(10) Patent No.: US 7,778,043 B2
(45) Date of Patent: Aug. 17, 2010

(54) FLUSH MOUNTED ASSEMBLY FOR HOUSING AN AMBIENT AIR ABNORMAL CONDITION SENSOR MODULE

(76) Inventor: Jason Rosenblatt, 1355 N. Sandburg Ter., Unit 2409, Chicago, IL (US) 60610

( * ) Notice: Subject to any disclaimer, the term of this patent is extended or adjusted under 35 U.S.C. 154(b) by 565 days.

(21) Appl. No.: 11/815,671

(22) PCT Filed: Feb. 24, 2006

(86) PCT No.: PCT/US2006/006458

§ 371 (c)(1),
(2), (4) Date: Aug. 7, 2007

(87) PCT Pub. No.: WO2006/093803

PCT Pub. Date: Sep. 8, 2006

(65) Prior Publication Data

US 2008/0144302 A1 Jun. 19, 2008

Related U.S. Application Data

(60) Provisional application No. 60/657,352, filed on Feb. 28, 2005.

(51) Int. Cl.
*H05K 7/02* (2006.01)

(52) U.S. Cl. ........................ 361/809; 439/334; 439/351; 439/361

(58) Field of Classification Search ................. 439/537, 439/334, 351, 361; 361/809
See application file for complete search history.

(56) References Cited

U.S. PATENT DOCUMENTS 4,645,286 A * 2/1987 Isban et al. ................. 439/571
4,952,157 A * 8/1990 Hudson et al. ................ 439/92
5,333,418 A 8/1994 Chambers (Continued)

OTHER PUBLICATIONS

Inventor: Jason R. Rosenblatt, PCT International Search Report, PCT/US06/06458, filing date: Feb. 24, 2006, 3 pages.

(Continued)

*Primary Examiner*—Hung S Bui
*Assistant Examiner*—Andargie M Aychillhum
(74) *Attorney, Agent, or Firm*—Cook Alex Ltd.

(57) ABSTRACT

A flush mounted assembly for housing an electronic or electro-mechanical module which detects abnormal conditions and responds to the detection of such abnormal conditions. The assembly includes a base mounted in an opening in a structural member such as a wall, partition or ceiling. The base includes a peripheral wall defining a shallow cavity with an outer open face and an inner wall. A laterally outwardly projecting flange extends from the peripheral side wall of the base for flush engagement with the structural member. The shallow cavity of the base is dimensioned to receive the electronic or electro-mechanical module. A closure plate is provided for the open outer face of the base. The closure face has a periphery dimensioned to close the open outer face of the shallow cavity in the base leaving only a narrow gap between the closure plate periphery and the base periphery wall to allow ambient air to enter the shallow cavity of the base and interact with the module. The module is clamped in a frame which fits into the shallow cavity of the base. Releasably engageable connections are provided to attach the closure plate to the container. An electrical junction box receives the base and is held thereto by fasteners.

9 Claims, 4 Drawing Sheets

U.S. PATENT DOCUMENTS

| | | | | |
|---|---|---|---|---|
| 5,555,455 | A | 9/1996 | McGinley | |
| 6,016,677 | A * | 1/2000 | Clark | 70/416 |
| 7,417,553 | B2 | 8/2008 | Young | |
| 2006/0125648 | A1 | 6/2006 | Young | |

OTHER PUBLICATIONS

Inventor: Jason R. Rosenblatt, PCT Written Opinion, PCT/US06/06458, Feb. 7, 2007, 3 pages.

* cited by examiner

FLUSH MOUNTED ASSEMBLY FOR HOUSING AN AMBIENT AIR ABNORMAL CONDITION SENSOR MODULE

The present application is a 371 of PCT/US2006/006458 Feb. 24, 2006 which claims benefit of 60/657,352 Feb. 28, 2005.

SUMMARY OF THE INVENTION

This invention is directed to an assembly for housing an electronic or electro-mechanical module which assembly can be flush mounted in a wall, partition, ceiling or other structural member having a suitable mounting surface. These commercially available modules include components mounted on a circuit board and are designed for specific purposes. Some are designed to detect and warn of abnormal ambient air conditions such as fire, smoke, carbon monoxide or radon gas by providing audio or visual alarms. Others are designed to perform such functions as stand alone speaker strobes, speakers, strobes, motion detectors and exit signs and other life safety devices or to regulate ambient conditions such as thermostats and humidity regulators. All of the aforementioned modules and other similar types may be housed in the assembly of this invention.

The assembly of this invention is suitable to house modules which need to be connected to power and signaling wires as well as modules which are powered by self contained sources of electrical power such as batteries and modules which require power wiring and batteries as a back up source of electrical power.

The assembly of this invention permits the flush or nearly flush mounting of the aforementioned modules in walls, partitions, ceilings and other structural members built of conventional material such as plaster, plasterboard, acoustical tile, plastic, wood, metal or paneling.

The assembly of this invention when used to house a smoke, fire or carbon monoxide detector module also complies with the requirements of building and safety codes concerned with the protection of electrical power wiring, ease of battery replacement and testing of the alarm.

The assembly of this invention provides a base that can be inserted into an opening in a wall or ceiling of a structure and taped into place for flush or near flush mounting. The base is sized to receive electronic and electro-mechanical modules of varying sizes and depending upon the power supply required for the electronic or electro-mechanical module and the local building code may be installed independently or mounted in a code approved electrical junction box.

The assembly of this invention also includes a frame which fits into and is removably attached to and is supported by the base. The frame may be varied to accommodate different electronic and electro-mechanical modules of the types previously described.

The assembly of this invention further includes a closure plate which is removably connected to the frame and can be customized to adapt to the environment in which it is installed in accordance with both functional and aesthetic requirements.

Other objects and purposes of the invention will be found in the following specification, claims and drawings.

BRIEF DESCRIPTION OF THE DRAWINGS

The invention is illustrated more or less diagrammatically in the following drawings wherein.

DESCRIPTION OF THE PREFERRED EMBODIMENT

Figure 2:
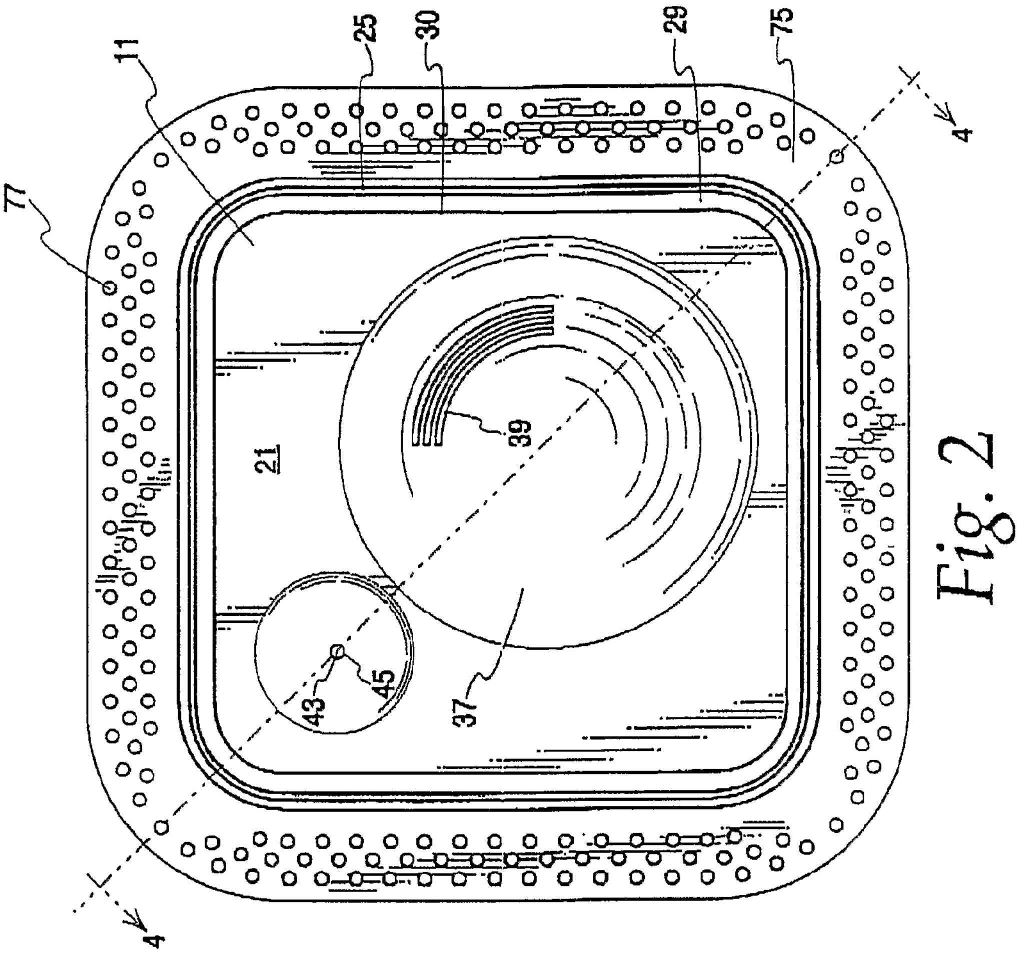
FIG. 2 is a facing view of the assembly prior to its flush installation.

The flush mounted assembly of this embodiment of the invention is intended to house an electronic module of the type which detects abnormal conditions and has a response means. It is shown in an embodiment in which the module is a photoelectric smoke detector and its response means is an audible alarm mounted on a circuit board. It should be understood and appreciated that the descriptive term electronic module which detects abnormal conditions and has a response means also include other types of electronic sensors which can be substituted for the previously mentioned photoelectric smoke detector and alarm. This embodiment includes the following components, namely, a closure plate 11, a base 13, a frame 15 which encloses a circuit board electronic module 17 and an electrical junction box 19. These components will be described in detail in the following detailed description of the invention.

Figure 1:
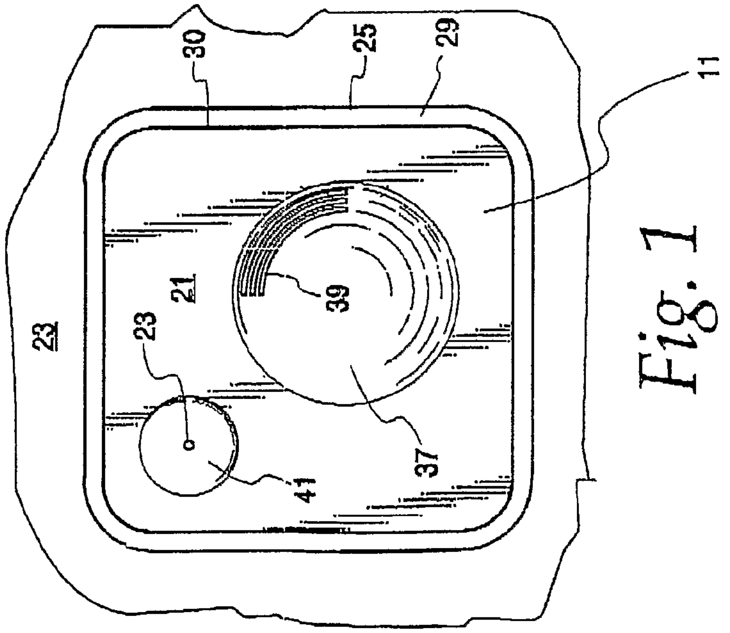
FIG. 1 is a plan view of a flush mounted assembly of this invention installed in a structural member, in this embodiment, a ceiling of a building.
Figure 3:
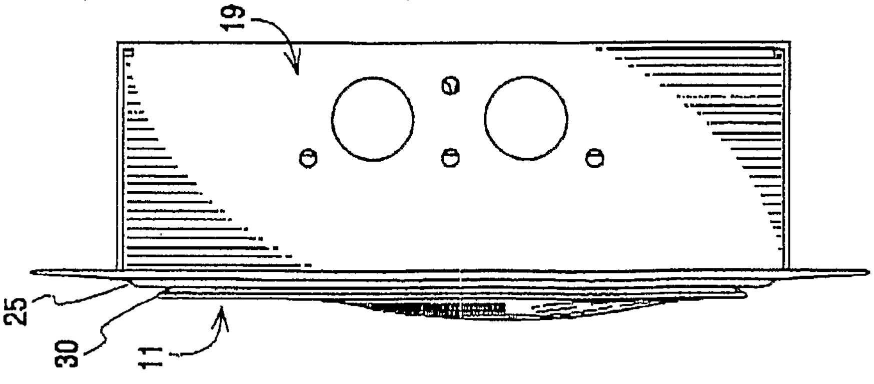
FIG. 3 is a side elevational view of the assembly of FIG. 1

FIG. 1 of the drawings shows the assembly 21 of this invention flush mounted in a ceiling 23 of a structure such as a building, vessel or vehicle. The only visible portion of the assembly 21 after installation is the closure plate 11 and the outer edge 25 of the peripheral side wall 27 of the base 13. A narrow gap 29 is defined by the spacing between the peripheral edge 30 of the closure plate and the outer edge 25 of the peripheral side wall 27 of the base 13 and this gap opens into the interior 33 of the base 13 to permit ambient air to enter therein. As can be seen most clearly in FIGS. 3 and 4 of the drawings, the peripheral edge 30 of the closure plate 11 is located to the front of the outer edge 25 of the peripheral side wall 27 of the base. This arrangement facilitates the entry of waves of heated air into the interior 33 of the base 13.

Figure 7:
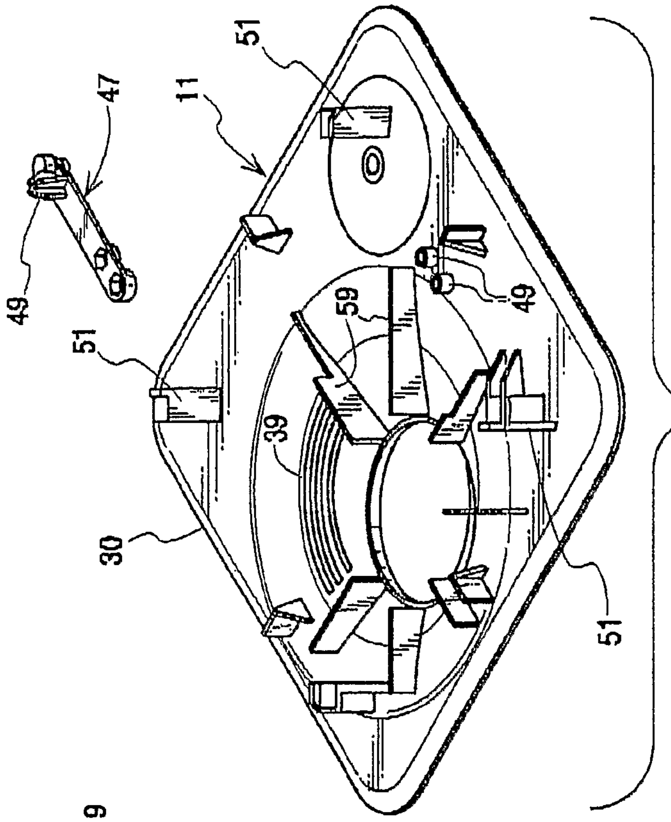
FIG. 7 is an underside view of the closure plate.

The closure plate 11 shown in FIG. 7 of the drawings is generally rectangular in shape with rounded corners providing its peripheral edge 30 with a shape similar to the outer edge 25 of the base side wall 27. The closure plate is formed of a suitable plastic or other material with a slight hemispherical protrusion 37 on the front face thereof. Formed in the protrusion are a series of arcuate passages 39 located in one quadrant of the protrusion to permit the passage of sound from the interior 33 of the base 13 to the outside. A second and smaller hemispherical protrusion 41 is also formed in the face of the closure plate 11. A small circular passage 43 is formed in the protrusion 41 and the passage receives a light transmitting test button 45 (see FIG. 4) which extends through this passage as is conventional in photoelectric smoke detectors and similar devices. The test button 45 is formed integrally with and at one end of a plastic arm 47 which is attached at its opposite end to bosses 48 formed on the closure plate 11. An inwardly projecting protrusion 49 is also formed integrally with the plastic arm adjacent the test button 45 to engage a test switch on the circuit board module 17. Mounting fingers 51 extend from the inside surface of the closure plate 11. Tabs 53 are provided at the inner distal ends of the mounting fingers 51 and these tabs engage sloping tabs 55 (See FIG. 6) formed on fingers 57 extending from the frame 15. The mounting fingers 51 both support the closure plate on the frame 15 and permit its removal to gain access to the interior 33 of the base 13 through rotation of the closure plate and its fingers relative to the sloping tabs 55 formed on the fingers 57 of the frame 15. The closure plate 11 may be reinstalled by positioning its mounting fingers and tabs adjacent the mounting fingers and tabs of the frame 15 and rotating the closure plate relative to the frame 15 and to the base 13. It should be noted that the reinstallation of the closure plate 11 is facilitated by the provision of the sloping tabs 55 on the fingers 57 of the frame 15. When the closure plate 11 is reinstalled, the tabs 53 of the mounting fingers 51 of the closure plate are aligned with the sloping tabs 55 and slight rotation of the closure plate relative to the frame and base moves the tabs 53 down the slope of the tabs 55 and into engagement therewith.

Radially extending upstanding ribs 59 are formed on the inside surface of the closure plate 11 to direct ambient air entering the assembly 21 through the narrow gap 29 to the sensor of the circuit board module 17.

Figure 4:
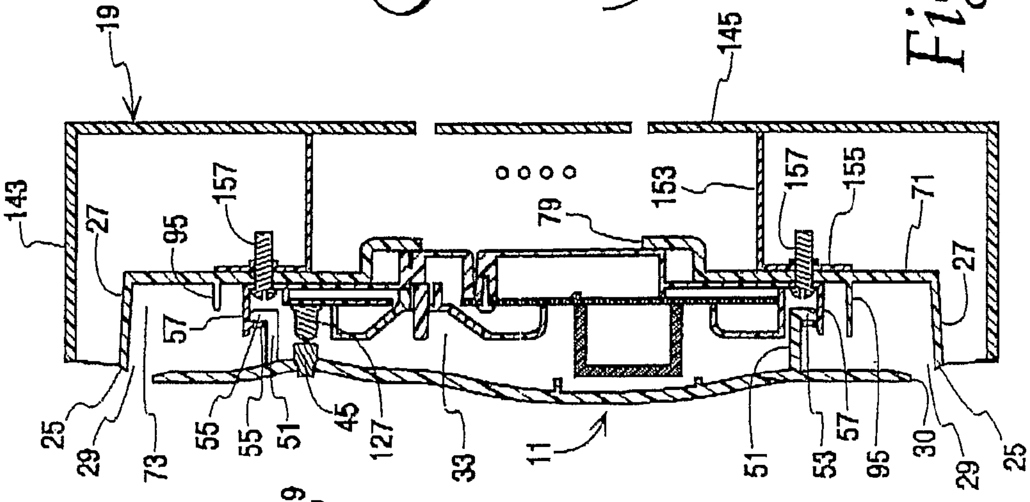
FIG. 4 is a cross sectional view taken along line 4-4 of FIG. 2 with some components of the installed circuit board module eliminated for clarity of illustration.
Figure 5:
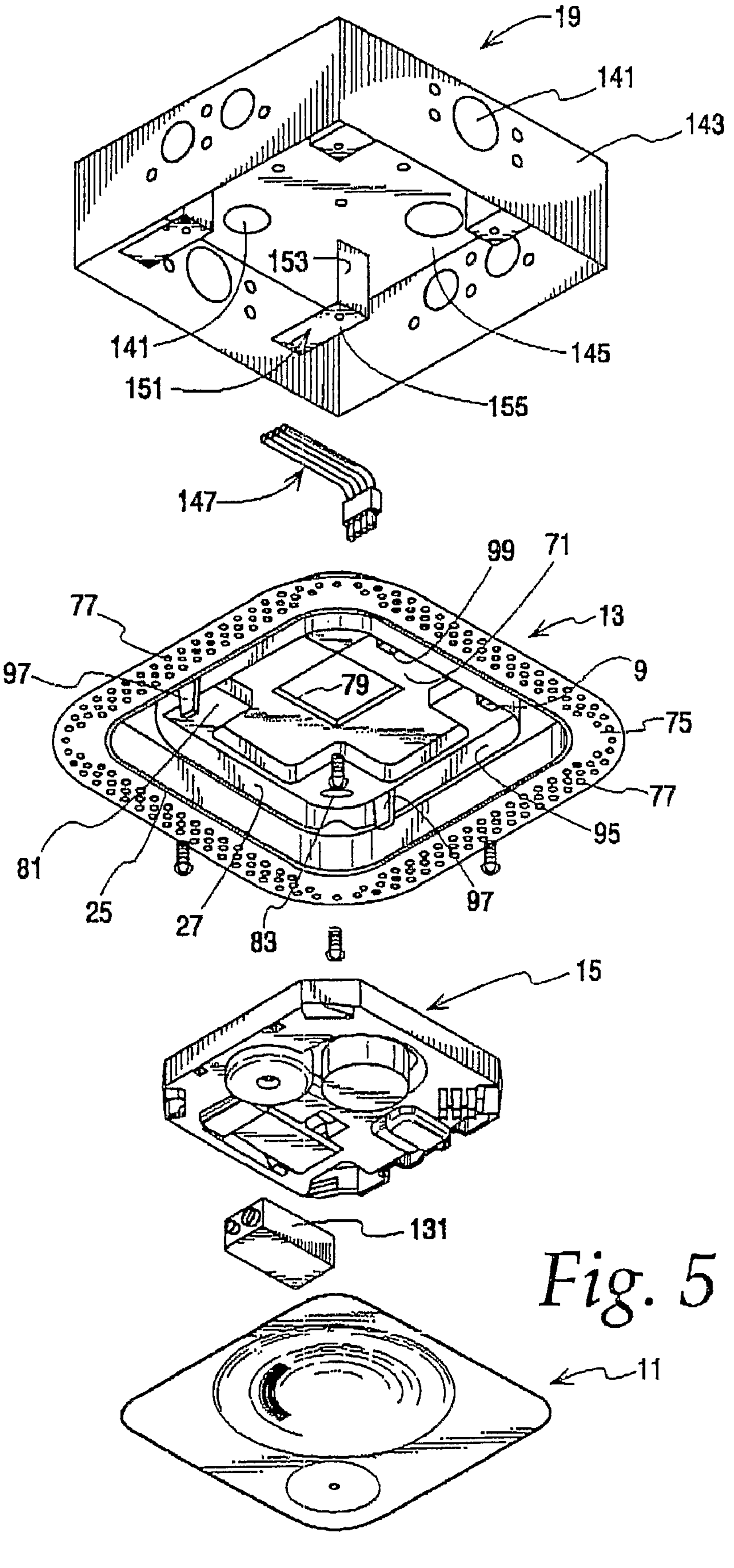
FIG. 5 is an exploded view of the assembly of this invention.

The base 13 shown in detail in FIGS. 4 and 5 is somewhat rectangular in shape and is preferably formed of a suitable injection molded plastic but other suitable materials may also be used. The base includes a peripheral side wall 27 which has an outer facing edge 25. This wall has four sides and rounded corners. Formed integrally with the base 13 is an inner wall 71 which together with the peripheral wall 27 define a shallow cavity 73. The shallow cavity forms the previously mentioned interior 33 of the base. Also formed integrally with the peripheral side wall 27 and the inner wall 71 of the base is a laterally outwardly projecting flange 75 which extends from the outer facing edge 25 of the peripheral side wall 27 on all four sides of the peripheral wall. The flange 75 is perforated with small circular passages 77 over which drywall tape (not shown) and through which a plastering compound (called "mud") (also not shown) are applied when the flange is positioned against the outer facing surface of a structural surface in which the assembly 21 of this invention is installed. Staples, screws, nails or adhesive, none of which is shown, may be used to fasten the flange 75 to the outer surface of the structural surface before the application of the dry wall tape and mud.

An opening 79 is formed in the inner wall 71 of the base 13. The four corners of the inner wall extend forward of the inner wall to form seats 81 for mounting on the junction box 19 in a manner to be hereinafter described. Arcuate slots 83 are formed in the seats 81 to receive fasteners to attach the base 13 to the junction box 19. An upstanding interior wall 95 is formed integrally with inner wall 71 of the base 81 and is located outwardly of the arcuate slots 83 of the seats 81. The interior wall 95 defines a space to receive and contain the frame 15. A pair of frame retaining fingers 97 are formed in opposite sides of the interior wall 95 and cooperate with a pair of lugs 99 formed on the side of the interior wall 95 connecting the opposite sides to secure the frame 15 in position and to permit its easy installation and removal.

Figure 6:
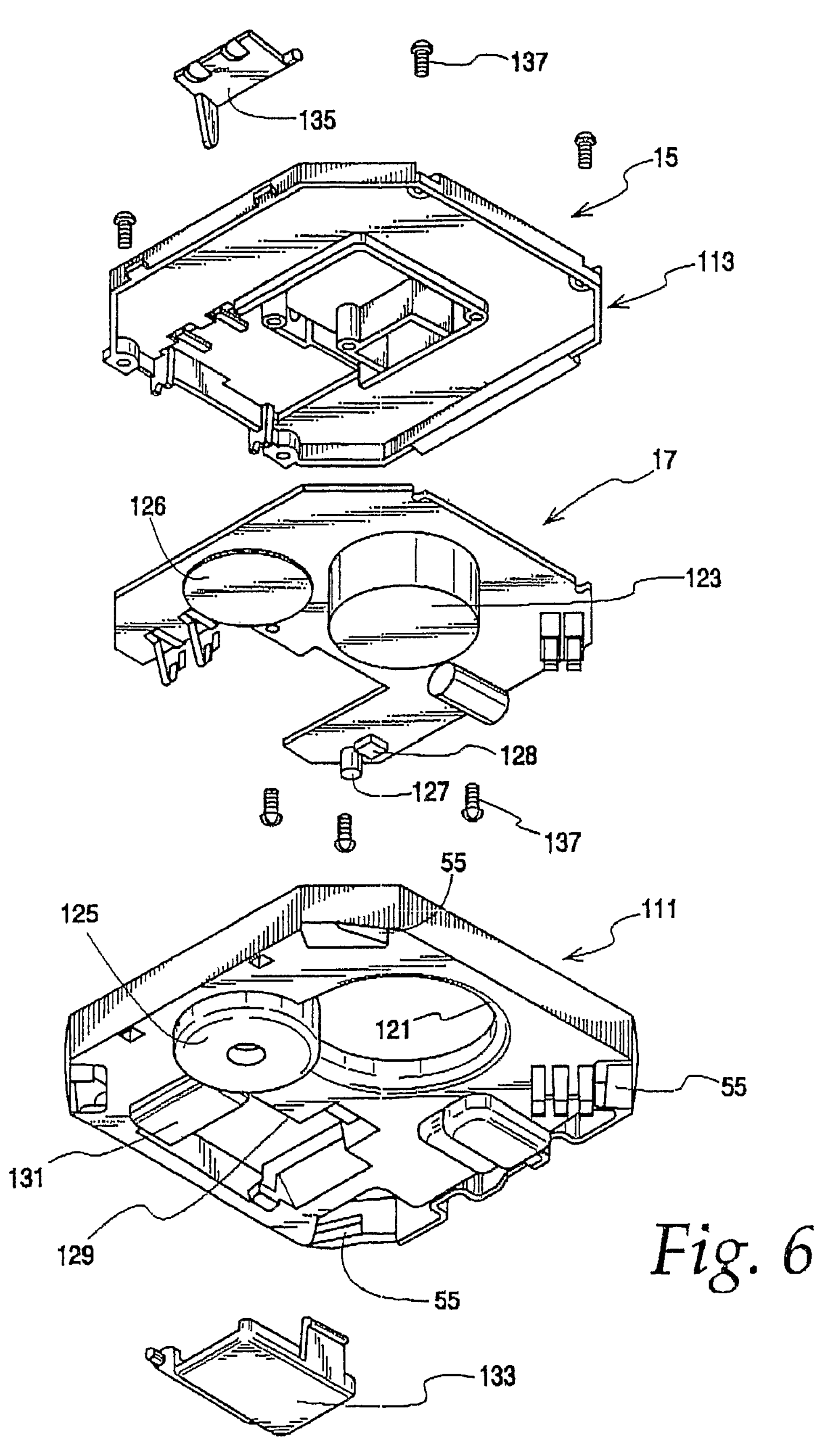
FIG. 6 is an exploded view of the frame and circuit board module of this invention.

The frame 15 which is injection molded of a suitable plastic and supports and protects the circuit board module 17 is shown in FIG. 5 of the drawings in relation to the other components of the assembly 21 of this invention. In FIG. 6, it is shown in an exploded view. The frame includes a front component 111 and a rear component 113 which are releasably connected to each other to support and protect the circuit board module 17. In this embodiment, the rear component 113 snaps into the front component 111 and captures the outer edges of the circuit board module 17 therebetween. The outer dimensions of the front and rear components of the frame remain essentially constant for the various types of modules which are carried by the frame with the internal configurations of the components varied in accordance with the particular module installed.

In this embodiment of the invention, the frame 15 is configured to carry a photoelectric smoke detector circuit board module 17. To accommodate the photoelectric smoke detector, a circular passage 121 is formed in the front component 111 to receive the detector element 123 of the module 17. Also, a speaker housing 125 is molded in the front component 115 to receive a speaker 126 of the module 17. An LED 127 and a test switch 128 are provided on the module 17. The switch 128 also functions as a silence switch. Other variations include a battery compartment cutaway 129 which receives a 9 volt battery 131. The battery compartment includes a battery compartment door 133 which is mounted on the front component 111 and a battery door latch 135 mounted on the rear frame component 113. Fasteners 137 are provided to securely connect the front and rear components and the circuit board module 17 together. Corresponding modifications can be made to the front and rear components of the frame 15 to accommodate other types of modules.

The junction box 19 may be a conventional sheet metal, cast metal or plastic box of the type used to receive electrical wiring which conducts 110 V to 220 V/230V AC power. In some jurisdictions, such a junction box is also required for lower voltage signaling and communication wires. The junction box 19 shown and described herein has been modified to accommodate the base 13 while meeting the code requirements for both conventional power wiring and signal and communication wiring. As is conventional, what are called punch out openings 141 are formed in the side walls 143 and in the base wall 145 of the junction box. These openings can be punched out by an electrician to permit power wires (not shown) which may be in conduit or not depending upon local building codes to be extended into the junction box so as to be connected to circuit board module 17. This connection between the power wires and the module is made by connector 147 shown in FIG. 5. The preferred junction box 19 shown most clearly in FIGS. 4 and 5 of the drawings is modified by the addition of L-shaped brackets 151 to the four corners of the junction box. Each bracket has a leg 153 which is welded or otherwise fastened to the base wall 145 of the junction box and a second leg 155 which extends at right angles to its first leg and has its distal end welded to one of the side walls 143 of the junction box. The second legs 145 engage the seats 81 of the base 13 and provide structures for receiving fastening screws 157 to attach the base 13 to the junction box 11.

The invention claimed is:

1. A flush mounted assembly for housing an electronic or electro-mechanical module which detects and responds to abnormal ambient air conditions, said assembly including:

a base mounted in an opening in a structural member such as a wall, partition or ceiling, said base including a peripheral side wall defining a shallow cavity with an open outer face and an inner wall, a laterally outwardly projecting flange extending from said peripheral side wall of said base for flush engagement with said structural member, said shallow cavity of said base dimensioned to receive said module, a closure plate for said outer face of said base cavity, said closure plate having a periphery dimensioned to close said open outer face of said base cavity leaving only a narrow gap between said closure plate periphery and said base periphery wall to allow ambient air to enter such shallow cavity of said base and interact with said module, a module located in said base, means to support said module in said base, and releasably engageable members to attach said closure plate to said base.

2. The flush mounted assembly of claim 1 including an electrical junction box which receives and supports said base.

3. The flush mounted assembly of claim 1 in which perforations are formed in said laterally outwardly projecting flange of said base.

4. The flush mounted assembly of claim 1 in which said module is clamped in a frame and said frame is supported in said base.

5. The flush mounted assembly of claim 1 in which said closure plate periphery is located outwardly of said base periphery wall.

6. The flush mounted assembly of claim 2 in which a passage leading to said electrical junction box is formed in said inner wall of said base.

7. The flush mounted assembly of claim 2 in which said base has seats offset from its inner wall and said electrical junction box has brackets which engage said seats to support said base in said electrical junction box.

8. The flush mounted assembly of claim 4 in which said module includes a circuit board, said frame is formed of front and rear portions and said portions clamp said circuit board between them.

9. The flush mounted assembly of claim 6 in which a removable closure plate is installed in said passage formed in said inner wall of said base.

* * * * *